(12) United States Patent
Hahin et al.

(10) Patent No.: US 7,751,717 B2
(45) Date of Patent: Jul. 6, 2010

(54) HOST PRINTED CIRCUIT BOARD WITH MULTIPLE OPTICAL TRANSCEIVERS

(75) Inventors: Jayne C. Hahin, Cupertino, CA (US); Gerald L. Dybsetter, Scotts Valley, CA (US); Luke M. Ekkizogloy, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 526 days.

(21) Appl. No.: 11/114,982

(22) Filed: Apr. 26, 2005

(65) Prior Publication Data

US 2006/0147215 A1    Jul. 6, 2006

Related U.S. Application Data

(60) Provisional application No. 60/640,351, filed on Dec. 30, 2004.

(51) Int. Cl.
    *H04B 10/00* (2006.01)
(52) U.S. Cl. .................. 398/135; 398/138; 398/140; 398/164
(58) Field of Classification Search ......... 398/135–139, 398/140, 164
    See application file for complete search history.

(56) References Cited

U.S. PATENT DOCUMENTS

| 5,039,194 | A  | * | 8/1991  | Block et al. .................. 385/88 |
| 6,446,867 | B1 | * | 9/2002  | Sanchez ..................... 235/454 |
| 6,665,497 | B1 | * | 12/2003 | Hamilton-Gahart et al. . 398/135 |
| 7,013,088 | B1 | * | 3/2006  | Jiang et al. .................. 398/139 |
| 7,090,509 | B1 | * | 8/2006  | Gilliland et al. ............ 439/76.1 |
| 2002/0076176 | A1 | * | 6/2002  | Flatt ........................... 385/100 |
| 2003/0128411 | A1 | * | 7/2003  | Aronson et al. ............. 359/152 |
| 2005/0084269 | A1 | * | 4/2005  | Dallesasse et al. .......... 398/135 |
| 2005/0089054 | A1 | * | 4/2005  | Ciancaglini et al. ......... 370/412 |

OTHER PUBLICATIONS qLogic: SANblade: 2-Gbps Fiber Channel to PCI Express Host Bus Adapters, Dec. 2003, pp. 1-3.*

* cited by examiner

*Primary Examiner*—Li Liu
(74) *Attorney, Agent, or Firm*—Workman Nydegger

(57) ABSTRACT

An optical transceiver host computing system (hereinafter simply referred as the "host") printed circuit board has multiple optical transceivers directly mounted to it. Each optical transceiver is configured to convert an electrical signal into an optical signal and to transmit the optical signal and to receive an optical signal and convert the received signal into an electrical signal. By directly mounting the optical transceivers to the host printed circuit board, an increased number of transceivers may be supported by a single host without increasing the overall size of the host.

21 Claims, 2 Drawing Sheets

HOST PRINTED CIRCUIT BOARD WITH MULTIPLE OPTICAL TRANSCEIVERS

CROSS-REFERENCE TO RELATED APPLICATIONS

This application claims the benefit of U.S. Provisional Application No. 60/640,351, filed Dec. 30, 2004, which is incorporated herein by reference in its entirety.

BACKGROUND OF THE INVENTION

1. The Field of the Invention

The present invention relates generally to optical transceivers and optical transceiver host computing systems (hereinafter referred to simply as "host"). More specifically, the present invention relates to directly mounting multiple optical transceivers without separate encasings to a host printed circuit board.

2. The Relevant Technology

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed there through, the intensity of the emitted light being a function of the current magnitude. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include a driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to perform various operations with respect to certain parameters of a data signal received by the optical receiver. A controller circuit (hereinafter referred to as the "controller") controls the operation of the laser driver and post amplifier.

The various components of the optical transceiver are often implemented as a single transceiver module. Each individual transceiver module generally has a separate encasing. The encasings can potentially be expensive and bulky. The individual transceiver modules may be coupled to a host to allow for host control of the transceiver modules. The transceiver modules generally have an electrical connection that is connected to a dedicated module connection in the host.

Most host computing systems have limited space for dedicated module connections, thereby limiting the number of transceiver modules that a single host can accommodate. However, as the speed and complexity of optical networks increases, there is a corresponding need to increase the number of optical transceivers supported by a single host. One solution to this has been to use larger hosts or to use multiple hosts. However, this is very expensive. In addition, larger hosts may be impractical for many networking applications in which space is at a premium.

Therefore, what would be advantageous is to further increase the number of optical transceivers supported by a single host, while advantageously keeping the size of the host small.

BRIEF SUMMARY OF THE INVENTION

The forgoing problems with the prior state of the art are overcome by the principles of the present invention. The principles of the present invention relate to an optical transceiver host computing system printed circuit board. The printed circuit board contains multiple optical transceivers that are directly mounted to the printed circuit board.

Each of the multiple optical transceivers comprises a Transmit Optical SubAssembly (TOSA) and a Receiver Optical SubAssembly (ROSA). The TOSA, consisting of an electro-optic transducer driver and an electro-optic transducer, is configured to convert electrical signals into optical signals. The ROSA, on the other hand, consisting of an optoelectronic transducer and a post-amplifier, is configured to convert an optical signal into an electrical signal. In some embodiments, a control module may also be implemented to control the TOSA and the ROSA.

As mentioned, each optical transceiver is directly mounted to the printed circuit board. This removes the need for each individual transceiver to have a separate encasing. The removal of the encasing makes the optical transceivers far less bulky. The removal of the encasing also potentially may lower the cost of the optical transceivers.

In addition, by significantly cutting down on the size of the optical transceivers, less printed circuit board area is needed for each optical transceiver. This allows for a greater number of optical transceivers to be supported by a single host. There is no corresponding need to increase the size of the host for networks requiring an increased number of optical transceivers. This is especially helpful in networks where space is at a premium.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The principles of the present invention relate to an optical transceiver host computing system (hereinafter simply referred as the "host") printed circuit board. The host printed circuit board has multiple optical transceivers directly mounted to it. Each optical transceiver is configured to convert an electrical signal into an optical signal and to transmit the optical signal and to receive an optical signal and convert the received signal into an electrical signal. By directly mounting the optical transceivers to the host printed circuit board, an increased number of transceivers may be supported by a single host without increasing the overall size of the host.

Figure 1:
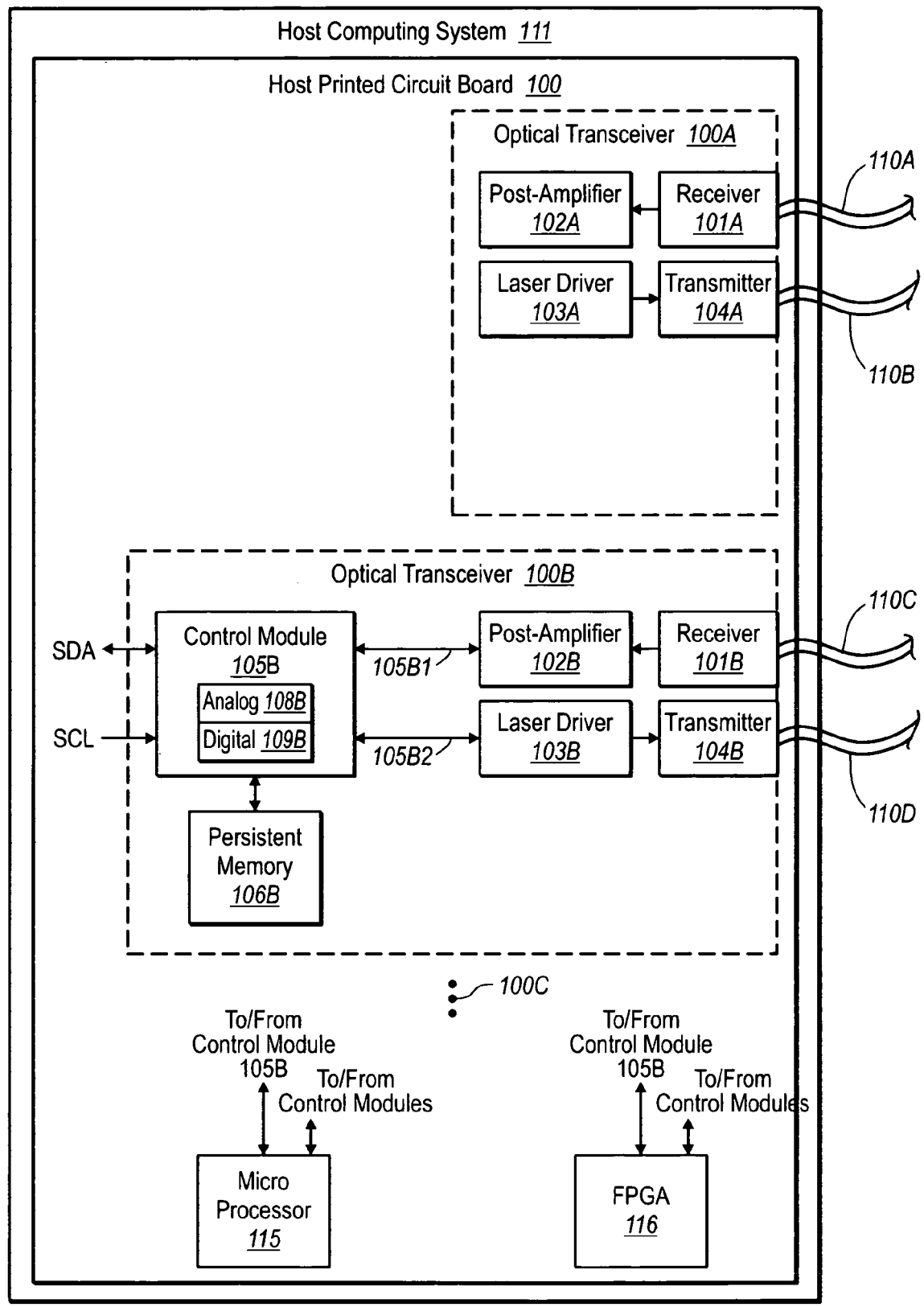
FIG. 1 schematically illustrates an example of a host printed circuit board that may implement features of the present invention.

FIG. 1 illustrates a host computing system 111 which includes a host Printed Circuit Board ("host PCB") 100 in which the principles of the present invention may be employed. Host 111 may be any computing system capable of controlling optical transceivers. Host 111 may be coupled to a key board or a mouse to allow for user control of the host. Host 111 may also be coupled to a monitor or other video device. Host 111 may include a host PCB 100 for implementing a number of optical transceivers. Host PCB 100 may be electrically connected to host 111 by any method of connecting circuit boards to computing systems known to one skilled in the art.

Host PCB 100 may be constructed of any printed circuit board material known to one skilled in the art. In addition, host PCB 100 may have electrical connections to allow for connection of any printed circuit board components. These electrical connections may be etched onto to the board or they may be created by any other technique known to one skilled in the art. These electrical connections allow the host 111 to send data to and receive data from a component mounted to host PCB 100. Host PCB 100 may be able to support 1G, 2G, 4G, 8G, 10G and higher bandwidth fiber optic links. Furthermore, host PCB 100 may be able to support transmitter/receivers of any form factor such as XFP, SFP and SFF, without restriction.

Host PCB 100 includes optical transceivers 100A and 100B. There may also be numerous other optical transceivers as represented by the vertical ellipses 100C. Each optical transceiver includes a Transmit Optical SubAssembly (TOSA) and a Receiver Optical SubAssembly (ROSA) that may transmit and receive optical signals. The TOSAs consist of an electro-optic transducer and an electro-optic transducer driver. The ROSAs consist of an optoelectronic transducer and a post-amplifier. Optical transceivers 100A, 100B and potentially 100C may also include a control module that is used to control the individual TOSAs and ROSAs and a persistent memory for storage of operational microcode.

Optical transceivers 100A, 100B, and potentially. 100C may be implemented as individual chips or chip sets that are directly mounted to host PCB 100. In the claims and in the written description, "mounted" is defined to mean attached, connected, or bonded directly to the host printed circuit board without the need for a separate encasing. Transceivers 100A, 100B, and potentially 100C, or more specifically the individual components or chip sets of the transceivers, may be mounted to host PCB 100 by any mounting technique known to one skilled in the art.

The optical transceiver 100A receives an optical signal 110A from an optical fiber using optoelectronic transducer 101A. Hereinafter, an optoelectronic transducer will also be referred to simply as a "receiver". The receiver 101A acts as an optoelectric transducer by transforming the optical signal into an electrical signal. The receiver 101A provides the resulting electrical signal to a post-amplifier 102A. The post-amplifier 102A amplifies the signal and provides the amplified signal to the host 111 using the printed circuit board electrical connections discussed previously.

The optical transceiver 100A may also receive electrical signals from the host 111 for transmission onto the optical transmit fiber. Specifically, an electro-optical transducer driver 103A receives the electrical signal from the host 111 using the printed circuit board electrical connections discussed previously, and drives the electro-optical transducer 104A with signals that cause the electro-optical transducer 104A to emit onto the optical transmit fiber optical signals 110B representative of the information in the electrical signal provided by the host 111. Hereinafter, an electro-optical transducer will also be referred to simply as a "transmitter". The transmitter may be, for example, a laser or Light Emitting Diode (LED). Since lasers are in common usage, an electro-optic transducer driver may also be referred to as a "laser driver" to reflect this common usage. In some embodiments, the laser driver 103A and the post-amplifier 102A may be integrated on a single chip. In other embodiments, the laser driver 103A and the post-amplifier 102A are on separate chips.

The optical transceiver 100B may be similarly configured. Specifically, the optical transceiver 100B receives an optical signal 110C from an optical receive fiber using receiver 101B. The receiver 101B acts as an optoelectric transducer by transforming the optical signal into an electrical signal. The receiver 101B provides the resulting electrical signal to a post-amplifier 102B. The post-amplifier 102B amplifies the signal and provides the amplified signal to the host 111 using the printed circuit board electrical connections discussed previously.

The optical transceiver 100B may also receive electrical signals from the host 111 for transmission onto an optical transmit fiber. Specifically, the laser driver 103B receives the electrical signal from the host 111 using the printed circuit board electrical connections discussed previously and drives the transmitter 104B (e.g., a laser or Light Emitting Diode (LED)) with signals that cause the transmitter 104B to emit onto the optical transmit fiber optical signals 110D representative of the information in the electrical signal provided by the host 111. Accordingly, the transmitter. 104B also serves as an electro-optic transducer.

As previously mentioned, host PCB 100 may have any number of additional optical transceivers as represented by vertical ellipses 100C. These additional optical transceivers also may include a TOSA with a laser driver and a transmitter and a ROSA with a post-amplifier and a receiver with the same functionality as described for optical transceivers 100A and 100B. The host 111 may receive data from these other optical transceivers 100C and may transmit data to these other transceivers 100C using the printed circuit board electrical connections discussed previously.

The behavior of the receivers 101A and 101B, the post-amplifiers 102A and 102B, the laser drivers 103A and 103B, and the transmitters 104A and 104B may vary dynamically due to a number of factors. For example, temperature changes, power fluctuations, and feedback conditions may each affect the performance of these components. Accordingly, the optical transceivers 100 may include a control module. Referring to FIG. 1, it is shown that optical transceiver 100A does not include a control module, while optical transceiver 100B does include a control module. This illustrates that implementation of a control module is not necessary to the principles of the present invention. Implementation of a control module, however, may give more control and flexibility to the optical transceiver.

Referring again to FIG. 1, a control module 105B, which may evaluate temperature and voltage conditions and other operational circumstances, and receive information from the post-amplifier 102B (as represented by arrow 105B1) and from the laser driver 103B (as represented by arrows 105B2). This allows the control module 105B to optimize the dynamically varying performance, and additionally detect when there is a loss of signal, and detect eye safety events. In some embodiments, post-amplifier 102B and control module 105B may be integrated on the same chip while in other embodiments post-amplifier 102B and control module 105B may be separate chips. In like manner, in some embodiments, laser driver 103B and control module 105B may be integrated on the same chip; while in other embodiments laser driver 103B and control module 105B may be separate chips. In additional embodiments, the post-amplifier 102B, laser driver 103B, and the control module 105B may be integrated on the same chip; while in other embodiments, post amplifier 102B, laser driver 103B, and control module 105B are implemented on separate chips.

Specifically, the control module 105B may counteract these changes by adjusting settings on the post-amplifier 102B and/or the laser driver 103B as also represented by the arrows 105B1 and 105B2 respectively. These settings adjustments are quite intermittent since they are only made when temperature or voltage or other low frequency changes so warrant.

The control modules 105B may have access to a persistent memory 106B, which in one embodiment, is an Electrically Erasable and Programmable Read Only Memory (EEPROM). Persistent memory 106B may also be any other non-volatile memory source. Persistent memory 106B may store microcode that is used by the control module 105B to control the operation of transceiver 100B. In some embodiments, persistent memory 106B and control module 105B may be integrated on the same chip; while in other embodiments persistent memory 106A and control module 105A may be on separate chips. In like manner, in some embodiments, the post-amplifier 102B, laser driver 103B, control module 105B, and the persistent memory 106B may be integrated on the same chip; while in other embodiments, post amplifier 102B, laser driver 103B, control module 105B, and persistent memory 106B are implemented on separate chips.

Figure 2:
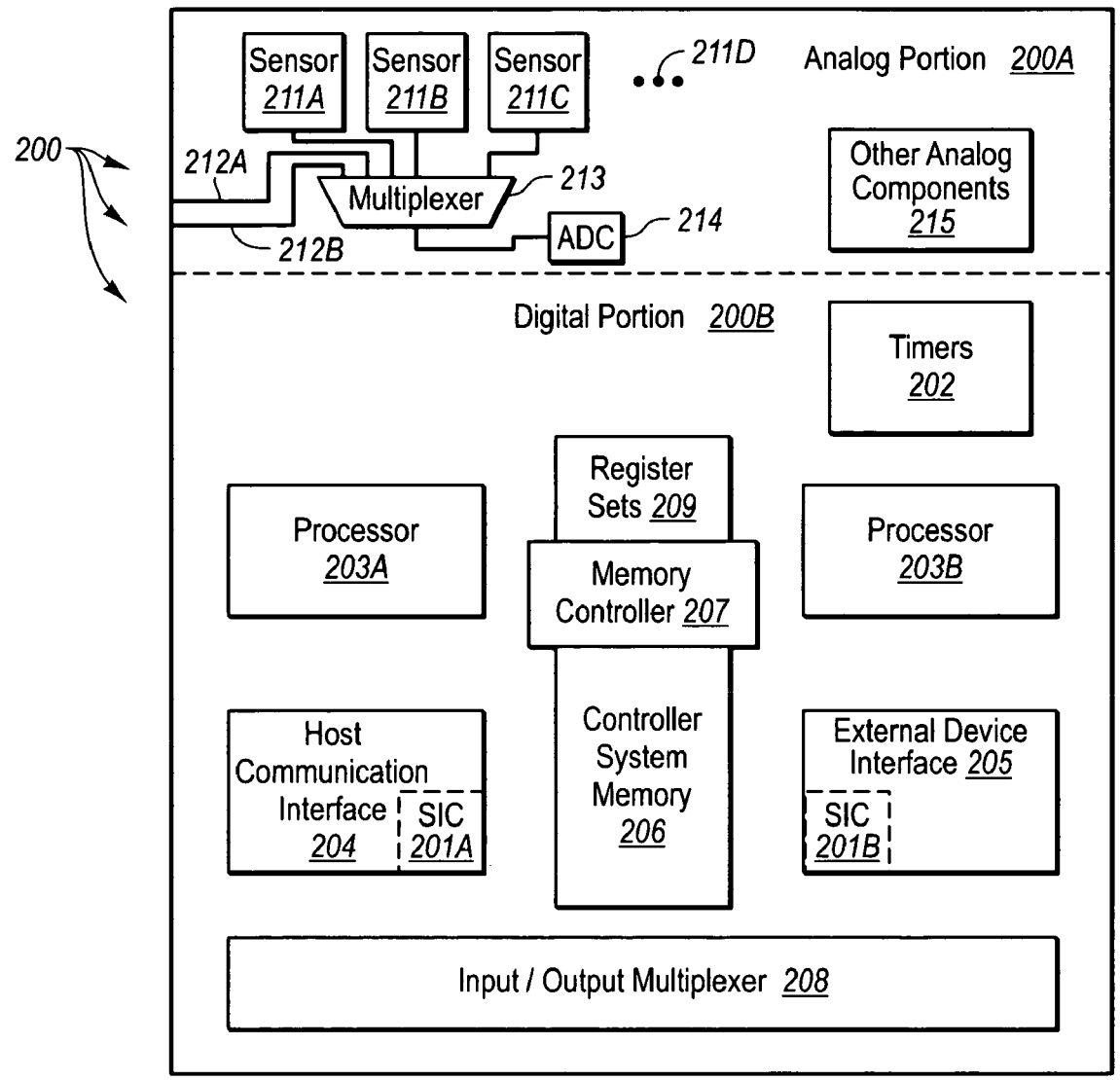
FIG. 2 schematically illustrates an example of a control module of FIG. 1.

The control module 105B includes both an analog portion 108B and a digital portion 109B. Together, they allow the control module to implement logic digitally, while still largely interfacing with the rest of the optical transceiver 100B using analog signals. FIG. 2 schematically illustrates an example 200 of the control module 105B in further detail. The control module 200 includes an analog portion 200A that represents an example of the analog portion 108B of FIG. 1, and a digital portion 200B that represents an example of the digital portion 109B of FIG. 1.

For example, the analog portion 200A may contain digital to analog converters, analog to digital converters, high speed comparators (e.g., for event detection), voltage based reset generators, voltage regulators, voltage references, clock generator, and other analog components. For example, the analog portion 200A includes sensors 211A, 211B, 211C amongst potentially others as represented by the horizontal ellipses 211D. Each of these sensors may be responsible for measuring operational parameters that may be measured from the control module 200 such as, for example, supply voltage and transceiver temperature. The control module may also receive external analog or digital signals from other components within the optical transceiver that indicate other measured parameters such as, for example, laser bias current, transmit power, receive power, laser wavelength, laser temperature, and Thermo Electric Cooler (TEC) current. Two external lines 212A and 212B are illustrated for receiving such external analog signals although there may be many of such lines.

The internal sensors may generate analog signals that represent the measured values. In addition, the externally provided signals may also be analog signals. In this case, the analog signals are converted to digital signals so as to be available to the digital portion 200B of the control module 200 for further processing. Of course, each analog parameter value may have its own Analog to Digital Converter (ADC). However, to preserve chip space, each signal may be periodically sampled in a round robin-fashion using a single ADC such as the illustrated ADC 214. In this case, each analog value may be provided to a multiplexer 213, which selects in a round robin fashion, one of the analog signals at a time for sampling by the ADC 214. Alternatively, multiplexer 213 may be programmed to allow any order of analog signals to be sampled by ADC 214.

As previously mentioned, the analog portion 200A of the control module 200 may also include other analog components 215 such as, for example, digital to analog converters, other analog to digital converters, high speed comparators (e.g., for event detection), voltage based reset generators, voltage regulators, voltage references, clock generator, and other analog components. The digital portion 200B of the control module 200 may include a timer module 202 that provides various timing signals used by the digital portion 200B. Such timing signals may include, for example, programmable processor clock signals. The timer module 202 may also act as a watchdog timer.

Two general-purpose processors 203A and 203B are also included. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 203A and 203B are each a 16-bit processor and may be identically structured. The precise structure of the instruction set is not important to the principles of-the present invention as the instruction set may be optimized around a particular hardware environment, and as the precise hardware environment is not important to the principles of the present invention.

A host communications interface 204 is used to communicate with the host 111, possibly implemented using a two-wire interface such as I²C shown in FIG. 1 as the serial data (SDA) and serial clock (SCL) lines on the optical transceiver 100B. Other host communication interfaces may also be implemented as well. Data may be provided from the control module 105B to the host 111 using this host communications interface to; allow for digital diagnostics and readings of temperature levels, transmit/receiver power levels, and the like. The external device interface 205 is used to communicate with, for example, other modules within the optical transceiver 100B such as, for example, the post-amplifier 102B, the laser driver 163B, or the persistent memory 106B.

The internal controller system memory 206 (not to be confused with the external persistent memory 106B) may be Random Access Memory (RAM) or non-volatile memory.

The memory controller 207 shares access to the controller system memory 206 amongst each of the processors 203A and 203B and with the host communication interface 204 and the external device interface 205. In one embodiment, the host communication interface 204 includes a serial interface controller 201A, and the external device interface 205 includes a serial interface controller 201B. The two serial interface controllers 201A and 201B may communicate using a two-wire interface such as I²C or may be another interface so long as the interface is recognized by both communicating modules. One serial interface controller (e.g., serial interface controller 201B) is a master component, while the other serial interface controller (e.g., serial interface controller 201A) is a slave component.

An input/output multiplexer 208 multiplexes the various input/output pins of the control module 200 to the various components within the control module 200. This enables different components to dynamically assign pins in accordance with the then-existing operational circumstances of the control module 200. Accordingly, there may be more input\output nodes within the control module 200 than there are pins available on the control module 200, thereby reducing the footprint of the control module 200.

Register sets 209 contain a number of individual registers. These registers may be used by the processors 203 to write microcode generated data that controls high speed comparison in optical transceiver 100B. Alternatively, the registers may hold data selecting operational parameters for comparison. Additionally, the registers may be memory mapped to the various components of optical transceiver 100B for controlling aspects of the component such as laser bias current or transmit power.

In some embodiments, there may be a single control module that is used to control all the TOSA and ROSA mounted to host PCB 100. The single control module may have the same functionality as control module 105B described above, although this is not required.

In some embodiments of the present inventions, host PCB 100 may also include a host microprocessor 115. Host microprocessor 115 may be mounted to host PCB 100 as discussed previously. Host microprocessor 115 may be any general purpose processor and may recognize instructions that follow a particular instruction set, and may perform normal general-purpose operations such as shifting, branching, adding, subtracting, multiplying, dividing, Boolean operations, comparison operations, and the like. Host microprocessor 115 may be used to communicate with the control modules of the various optical transceivers using the SDA and SCL lines so as to at least partially control the optical transceivers. For example, host microprocessor 115 may page in different operational microcode to the control modules as needed. When executed this microcode may control the operation of the optical transceivers. In addition, host microprocessor 115 may direct the control modules to cause the optical transceivers to perform different operations such as diagnostics of operational parameters.

In other embodiments, host PCB 100 may also include a Field Programmable Gate Array (FPGA) 116. FPGA 116 may be mounted to host PCB 100 as discussed. Generally, the control modules in the various optical transceivers have the same host interface address. This means that if the host microprocessor 115 or another source tries to communicate with one control module, for example control module 105A, the communication would be received by all the control modules. FPGA 116 may be programmed to direct the communication to the appropriate control module. In this way, host microprocessor 115 is able to send unique commands to a single optical transceiver.

Accordingly, the principles of the present invention relate to an optical transceiver host printed circuit board that implements multiple optical transceivers. In many networking applications there is an increased demand for more optical transceivers per host. However, there may not be enough room to implement individual modules with separate encasings. The principles of the present invention allow for individual optical transceivers to be directly mounted to the printed circuit board without separate encasings. This allows for an increased number of optical transceivers in a single host. Additionally, there is no corresponding need to increase to the overall size of host, which is beneficial in optical networks where space is at a premium. Accordingly, the principles of the present invention are a significant advancement in the art of optical transceivers and optical transceiver host computing systems.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A host computing system comprising:
an optical transceiver host printed circuit board including an electrical connection that is connected to a dedicated module connection in the host, the optical transceiver host printed circuit board including:
a first optical transceiver, wherein the first optical transceiver comprises:
a first electro-optic transducer driver;
a first electro-optic transducer coupled to the first electro-optic transducer driver so as to receive an electrical signal from the first electro-optic transducer driver and convert the received electrical signal into an optical signal;
a first optoelectronic transducer configured during operation to convert a received optical signal into a corresponding received electrical signal; and
a first post-amplifier coupled to the first optoelectronic transducer so as to amplify the received electrical signal; and
a second optical transceiver, wherein the second optical transceiver comprises:
a second electro-optic transducer driver;
a second electro-optic transducer coupled to the second electro-optic transducer driver so as to receive an electrical signal from the second electro-optic transducer driver and convert the received electrical signal into an optical signal;
a second optoelectronic transducer configured during operation to convert a received optical signal into a corresponding received electrical signal; and
a second post-amplifier coupled to the second optoelectronic transducer so as to amplify the received electrical signal;
wherein the first and second optical transceivers are directly mounted to the host printed circuit board; and
wherein the first and second optical transceivers do not implement a separate encasing from one another;

a first control module configured to control the operation of the first electro-optic transducer driver and the first post-amplifier;

a second control module configured to control the operation of the second electro-optic transducer driver and the second post-amplifier;

a microprocessor that is directly mounted to the printed circuit board configured to at least partially control the first and second optical transceivers by providing different operational microcode to the first and second control modules; and a logic device directly mounted to the host printed circuit board, wherein the logic device is configured to direct communication from the microprocessor to the first control module such that the second control modules does not receive the communication; and direct communication from the microprocessor to the second control module such that the first control module does not receive the communication.

2. A host computing system in accordance with claim 1, wherein a single control module is used to control the first and second optical transceivers.

3. A host computing system in accordance with claim 1, wherein the first optical transceiver further comprises:
a first persistent memory directly mounted to the printed circuit board, wherein the persistent memory is coupled to the first control module.

4. A host computing system in accordance with claim 3, wherein the first post-amplifier, the first electro-optic transducer driver, the first persistent memory, and the first control module are integrated on a single chip.

5. A host computing system in accordance with claim 3, wherein the first post-amplifier, the first electro-optic transducer driver, the first persistent memory, and the first control module are integrated on separate chips.

6. A host computing system in accordance with claim 3, wherein the first persistent memory and the first control module are integrated on a single chip.

7. A host computing system in accordance with claim 3, wherein the first persistent memory and the first control module are on separate chips.

8. A host computing system in accordance with claim 1, wherein the first post-amplifier and the first control module are integrated on a single chip.

9. A host computing system in accordance with claim 1, wherein the first post-amplifier and the first control module are on separate chips.

10. A host computing system in accordance with claim 1, wherein the first electro-optic transducer driver and the first control module are integrated on a single chip.

11. A host computing system in accordance with claim 1, wherein the first electro-optic transducer driver and the first control module are on separate chips.

12. A host computing system in accordance with claim 1, wherein the first post-amplifier, the first electro-optic transducer driver, and the first control module are integrated on a single chip.

13. A host computing system in accordance with claim 1, wherein the first post-amplifier, the first electro-optic transducer driver, and the first control module are integrated on separate chips.

14. A host computing system in accordance with claim 1, wherein at least one of the first and second electro-optic transducers is one of a laser or a Light Emitting Diode (LED).

15. A host computing system in accordance with claim 1, wherein the first post-amplifier and the first electro-optic transducer driver are integrated on a single chip.

16. A host computing system in accordance with claim 1, wherein the first post-amplifier and the first electro-optic transducer driver are on separate chips.

17. A host computing system an according with claim 1, wherein the logic device is a Field Programmable Gate Array.

18. A host computing system in accordance with claim 1, wherein the first optical transceiver is one of a 1G laser transceiver, a 2G laser transceiver, a 4G laser transceiver, a 8G laser transceiver, a 10G laser transceiver, or a laser transceiver suitable for fiber optic links greater than 10G.

19. A host computing system in accordance with claim 1, wherein the first optical transceiver is one of a XFP laser transceiver, a SFP laser transceiver, or a SFF laser transceiver.

20. A host printed circuit board in accordance with claim 1, wherein the operational microcode causes the first and second optical transceivers to perform different diagnostic operations of operational parameters.

21. An optical transceiver host printed circuit board comprising:
a first optical transceiver, wherein the first optical transceiver comprises:
a first electro-optic transducer driver;
a first electro-optic transducer coupled to the first electro-optic transducer driver so as to receive an electrical signal from the first electro-optic transducer driver and convert the received electrical signal into an optical signal;
a first optoelectronic transducer configured during operation to convert a received optical signal into a corresponding received electrical signal; and
a first post-amplifier coupled to the optoelectronic transducer so as to amplify the received electrical signal; and
a first control module configured to control the operation of the first electro-optic transducer driver and the first post-amplifier, the first control module comprising: at least one first sensor, a first analog-to-digital converter, at least one first processor, a first system memory, and a first input/output multiplexer;
a second optical transceiver, wherein the second optical transceiver comprises:
a second electro-optic transducer driver;
a second electro-optic transducer coupled to the second electro-optic transducer driver so as to receive an electrical signal from the second electro-optic transducer driver and convert the received electrical signal into an optical signal;
a second optoelectronic transducer configured during operation to convert a received optical signal into a corresponding received electrical signal; and
a second post-amplifier coupled to the optoelectronic transducer so as to amplify the received electrical signal; and
a second control module configured to control the operation of the second electro-optic transducer driver and the second post-amplifier, the second control module comprising: at least one second sensor, a second analog-to-digital converter, at least one second processor, a second system memory, and a second input/output multiplexer;
wherein the first and second optical transceivers are directly mounted to the host printed circuit board in a side-by side adjacent configuration, and wherein the first and second optical transceivers do not implement individual casings for each optical transceiver; and an FPGA directly mounted to host printed circuit board, wherein the FPGA is configured to:
  direct communication from a host microprocessor to the first control module such that the second control module does not receive the communication; and
  direct communication from the host microprocessor to the second control module such that the first control module does not receive the communication.

* * * * *